(12) United States Patent
Ichikawa (10) Patent No.: US 7,868,385 B2
(45) Date of Patent: Jan. 11, 2011

(54) SEMICONDUCTOR DEVICE WITH INCREASED DRAIN BREAKDOWN VOLTAGE

(75) Inventor: Hiromichi Ichikawa, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 18 days.

(21) Appl. No.: 11/072,268

(22) Filed: Mar. 7, 2005

(65) Prior Publication Data

US 2006/0081924 A1     Apr. 20, 2006

(30) Foreign Application Priority Data

Oct. 15, 2004   (JP)   ............... 2004-301787

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |

(52) U.S. Cl. ................. 257/343; 257/378; 257/408
(58) Field of Classification Search ............ 257/343, 257/378, 408
See application file for complete search history.

(56) References Cited

U.S. PATENT DOCUMENTS

| | | | | |
|---|---|---|---|---|
| 5,856,219 | A * | 1/1999 | Naito et al. ............ | 438/241 |
| 6,187,636 | B1 * | 2/2001 | Jeong ..................... | 438/267 |
| 6,563,193 | B1 * | 5/2003 | Kawaguchi et al. ..... | 257/575 |
| 6,696,734 | B2 | 2/2004 | Kikuchi et al. | |
| 6,762,456 | B1 * | 7/2004 | D'Anna et al. ......... | 257/335 |
| 6,831,332 | B2 * | 12/2004 | D'Anna et al. ......... | 257/343 |
| 7,056,797 | B2 | 6/2006 | Kikuchi et al. | |
| 2003/0218209 | A1 | 11/2003 | D'Anna et al. | |

FOREIGN PATENT DOCUMENTS

| | | |
|---|---|---|
| JP | 61-139070 | 6/1986 |
| JP | 2-1938 | 1/1990 |
| JP | 6-232153 | 8/1994 |
| JP | 2002-124671 | 4/2002 |
| JP | 2002-217406 A | 8/2002 |
| JP | 2002-217407 A | 8/2002 |

OTHER PUBLICATIONS

Chinese Office Action dated Oct. 26, 2007 issued in corresponding Chinese Application No. 2005-10058902.1.

* cited by examiner

*Primary Examiner*—Howard Weiss
(74) *Attorney, Agent, or Firm*—Westerman, Hattori, Daniels & Adrian, LLP (57) ABSTRACT

A semiconductor device is disclosed that is capable of improving the drain breakdown voltage during operation. The semiconductor device includes a first drain region that is arranged to extend from the vicinity of an end portion of the gate electrode at the drain electrode side in a direction toward the drain electrode, a drain contact region that is formed within the first drain region and comes into contact with the drain electrode, and a second drain region that is formed around and underneath the drain contact region. The second drain contact region has an impurity concentration that is higher than the impurity concentration of the first drain contact region and lower than the impurity concentration of the drain contact region. An end portion of the second drain region at the gate electrode side is positioned away from the end portion of the gate electrode by a predetermined distance.

20 Claims, 8 Drawing Sheets

SEMICONDUCTOR DEVICE WITH INCREASED DRAIN BREAKDOWN VOLTAGE

BACKGROUND OF THE INVENTION

1. Field of the Invention

The present invention relates generally to a semiconductor device and a manufacturing method thereof, and particularly to a field effect transistor that has a high drain breakdown voltage during operation.

2. Description of the Related Art

In an electronic apparatus such as a laptop computer or a digital video camera, plural Li-ion rechargeable batteries that are serially connected may be used as a power source. Such an electronic apparatus may use a power source IC as a power source circuit for charging the Li-ion rechargeable battery and a power source circuit for supplying power to the electronic apparatus while charging the Li-ion rechargeable battery. In comparison with a regular logic IC, the power source IC uses a relatively high power supply voltage of around a dozen to several dozen volts. Also, in the power source IC, high integration of numerous circuits including power source circuits and power control logic circuits is demanded, and in turn, plural power supply voltages may be used within one IC chip, for example.

When a transistor such as a MOS transistor that is integrated in the power source IC is in operation, a drain breakdown voltage that is greater than the power supply voltage may be required, and when the drain breakdown voltage is insufficient, the power IC may overheat and the power consumption may be increased. In the prior art, measures are taken with respect to the circuit for securing a sufficient breakdown voltage; namely, a multiple connection of MOS transistors is realized. However, in such a case a large number of MOS transistors are required, this being an obstacle to reducing the area of the IC chip (i.e., miniaturization of the IC chip).

In turn, in recent years and continuing, measures that are addressed to the MOS transistor itself are being developed for increasing the drain breakdown voltage. For example, a high breakdown voltage MOS transistor is being used such as an offset MOS transistor having a drain electrode and a gate electrode that are set apart from one another via an offset region with a low impurity concentration, or a LD (Laterally Diffused) MOS transistor having a drain electrode and a gate electrode that are set apart from one another via a field oxide layer. In such high breakdown voltage MOS transistors, a drain region portion that comes into contact with the drain electrode forms an impurity diffused region with a higher concentration of impurities compared to the rest of the drain region so that the contact resistance may be decreased at the contact region.

However, in a case where a MOS transistor is arranged to include a first drain region having a relatively low impurity concentration and extending from a region directly below the gate electrode to a region in contact with the drain electrode, and a contact region within the first drain region to come into contact with the drain electrode and having a higher impurity concentration compared to the first drain region, bipolar action may easily occur and the drain breakdown voltage may be decreased. It is noted that bipolar action refers to a sudden increase in the drain current as a result of an avalanche breakdown that occurs when a high voltage is simultaneously applied to the drain and the gate.

Figure 1:
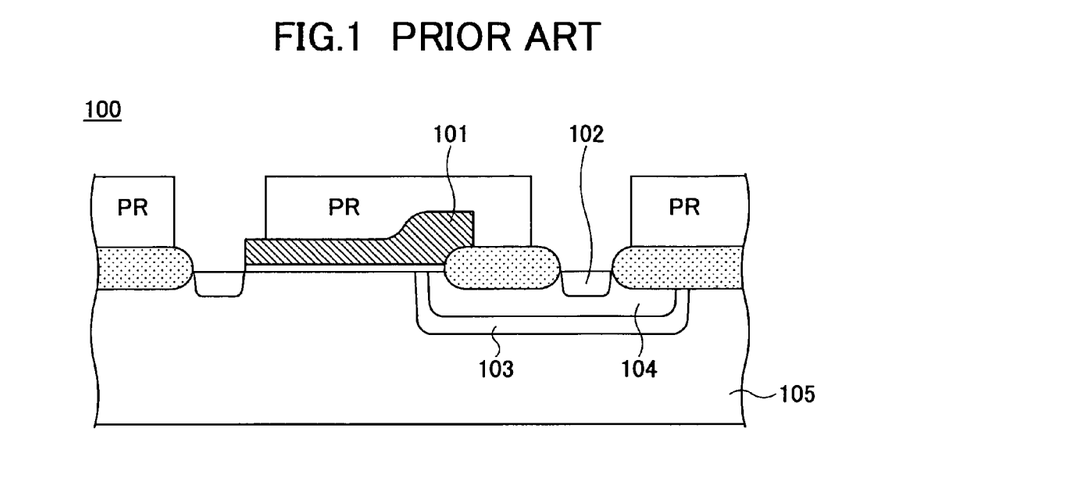
FIG. 1 is a cross-sectional diagram showing a configuration of a semiconductor device according to the prior art.

In turn, a MOS transistor as is shown in FIG. 1 that is arranged to prevent the generation of bipolar action is disclosed in Japanese Laid-Open Patent Publication No. 2002-124671. The MOS transistor 100 of FIG. 1 includes a first drain region 102 that extends from a region directly below an end portion of a gate electrode 101 and below a high concentration drain region 102, and a second drain region 104 that is formed within the first drain region 103 and is arranged to have a higher impurity concentration compared to the first drain region 103.

However, in the example of FIG. 1, the first drain region 103 as well as the second drain region 104 are arranged to extend over a region directly below the gate electrode 101. In such a case, when a high voltage is applied to the high concentration drain region 102, a short channel effect may easily occur. It is noted that the short channel effect may be prevented by securing a sufficient gate length; however, this leads to enlargement of the device area to thereby hamper miniaturization of the IC chip.

Also, in a case where the second drain region 104 is not provided, since the high concentration drain region 102 has a high concentration of impurities, a depletion layer generated between the first drain region 103 and the substrate 105 may be prevented from being diffused toward the first drain region 103. Thereby, sufficient field dispersion may not be realized in the region, and as a result, the drain breakdown voltage during operation may be decreased.

SUMMARY OF THE INVENTION

The present invention has been conceived in response to the one or more problems of the related art and its object is to provide a semiconductor device with a higher drain breakdown voltage during operation and a method of manufacturing such a semiconductor device.

According to an aspect of the present invention, a semiconductor device is provided that includes:

a semiconductor substrate of a first conductivity type;

a gate insulating film provided on a surface of the semiconductor substrate;

a gate electrode provided on the gate insulating film;

a first drain region of a second conductivity type corresponding to an opposite conductivity type with respect to the first conductivity type, the first drain region being provided in the vicinity of an end portion of the gate electrode;

a drain contact region of the second conductivity type that is provided within the first drain region, the drain contact region having an impurity concentration that is higher than an impurity concentration of the first drain region; and a second drain region of the second conductivity type that is provided around and underneath the drain contact region, wherein the second drain region is arranged to have an impurity concentration that is lower than the impurity concentration of the drain contact region and higher than the impurity concentration of the first drain region; and an end portion of the second drain region at the gate electrode side is positioned away from the end portion of the gate electrode by a predetermined distance.

According to an embodiment of the present invention, by providing a low impurity concentration second drain region of the same conductivity type underneath a high impurity concentration drain contact region, a concentration gradient with respect to a depth direction from the high concentration drain contact region via the second drain region to the junction between a first drain region and a semiconductor substrate of an opposite conductivity type may be reduced, and thereby, a sufficient thickness may be secured for a depletion layer formed at the junction between the first drain region at the gate electrode side and the semiconductor substrate of the opposite conductivity type to improve a field dispersion characteristic. By positioning the second drain region away from an end portion of the gate electrode, a short channel effect may be prevented. In this way, a drain breakdown voltage during operation may be improved.

According to another aspect of the present invention, a semiconductor device is provided that includes:

a semiconductor substrate of a first conductivity type;

a gate insulating film provided on a surface of the semiconductor substrate;

a gate electrode provided on the gate insulating film;

a first drain region of a second conductivity type corresponding to an opposite conductivity type with respect to the first conductivity type, the first drain region being provided in the vicinity of an end portion of the gate electrode;

a drain contact region of the second conductivity type that is provided within the first drain region, the drain contact region having an impurity concentration that is higher than an impurity concentration of the first drain region; and a second drain region of the second conductivity type that is provided around and underneath the drain contact region, wherein the second drain region is arranged to have an impurity concentration that is lower than the impurity concentration of the drain contact region and substantially equal to the impurity concentration of the first drain region;

a bottom portion of the second drain region is positioned at a depth that is greater than a depth of a bottom portion of the first drain region; and an end portion of the second drain region at the gate electrode side is positioned away from the end portion of the gate electrode by a predetermined distance.

According to an embodiment of the present invention, by providing a low impurity concentration second drain region of the same conductivity type underneath a high impurity concentration drain contact region and arranging the bottom portion of the second drain region at a deeper position than the bottom portion of a first drain region, a sufficient thickness may be secured for a depletion layer formed at the junction between the first drain region at the gate electrode side and the semiconductor substrate of the opposite conductivity type to improve a field dispersion characteristic. By positioning the second drain region away from an end portion of the gate electrode, a short channel effect may be prevented. In this way, a drain breakdown voltage during operation may be improved.

According to another aspect of the present invention, a method of manufacturing a semiconductor device is provided, the method including the steps of:

forming a gate insulating film and a gate electrode on a semiconductor substrate of a first conductivity type;

forming a first drain region by implanting at a first predetermined dosage a first impurity of a second conductivity type corresponding to an opposite conductivity type with respect to the first conductivity type at a region of the semiconductor substrate in the vicinity of an end portion of the gate electrode;

forming a second drain region substantially within the first drain region by implanting a second impurity of the second conductivity type at a second dosage that is greater than the first dosage; and forming a drain contact region within the second drain region by implanting a third impurity of the second conductivity type at a third dosage that is greater than the second dosage;

wherein the step of forming the second drain region includes implanting the second impurity in a manner such that the second drain region is positioned away from the end portion of the gate electrode by a predetermined distance.

According to an embodiment of the present invention, by implanting a low impurity concentration second drain region of the same conductivity type underneath a high impurity concentration drain contact region in a manner such that the second drain region is arranged at a position deeper than the first drain region, a concentration gradient with respect to a depth direction from the high concentration drain contact region via the second drain region to the junction between the first drain region and a semiconductor substrate of an opposite conductivity type may be reduced, and thereby, a sufficient thickness may be secured for a depletion layer formed at the junction between the first drain region at the gate electrode side and the semiconductor substrate of the opposite conductivity type to improve a field dispersion characteristic. By positioning the second drain region away from an end portion of the gate electrode, a short channel effect may be prevented. In turn, a drain breakdown voltage during operation may be improved.

DESCRIPTION OF THE PREFERRED EMBODIMENTS

In the following, preferred embodiments of the present invention are described with reference to the accompanying drawings.

First Embodiment

Figure 2:
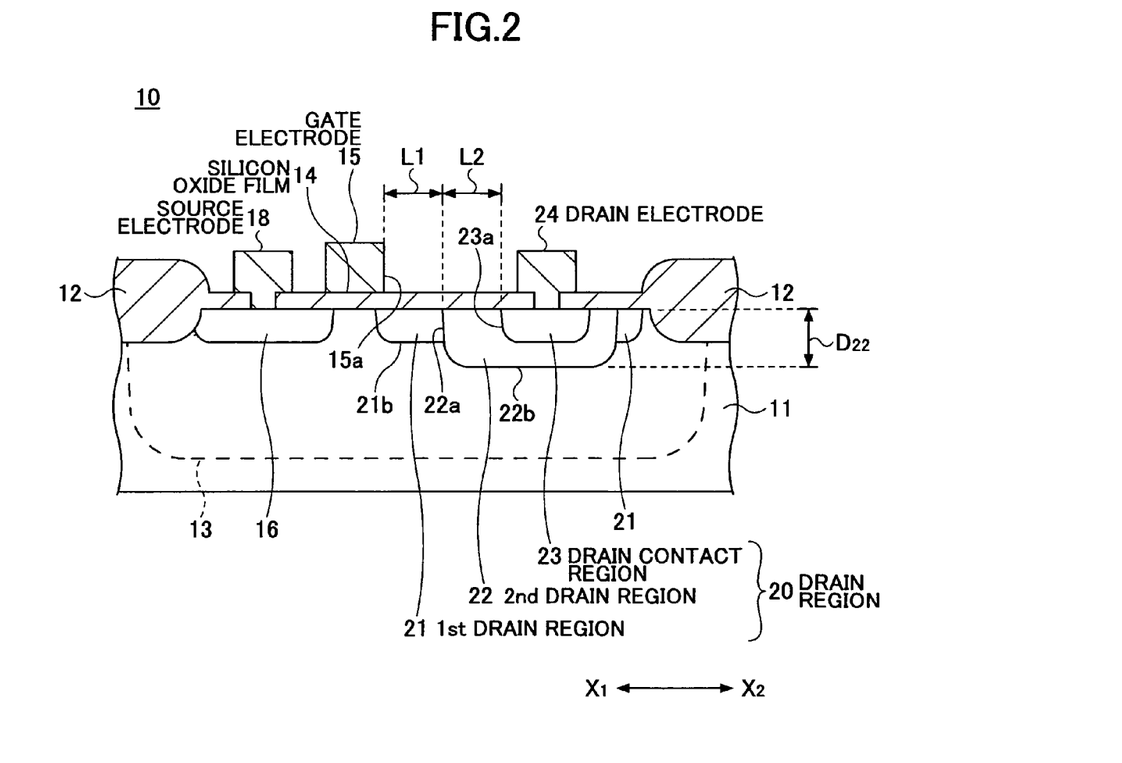
FIG. 2 is a cross-sectional diagram showing a configuration of a semiconductor device according to a first embodiment of the present invention.
Figure 3:
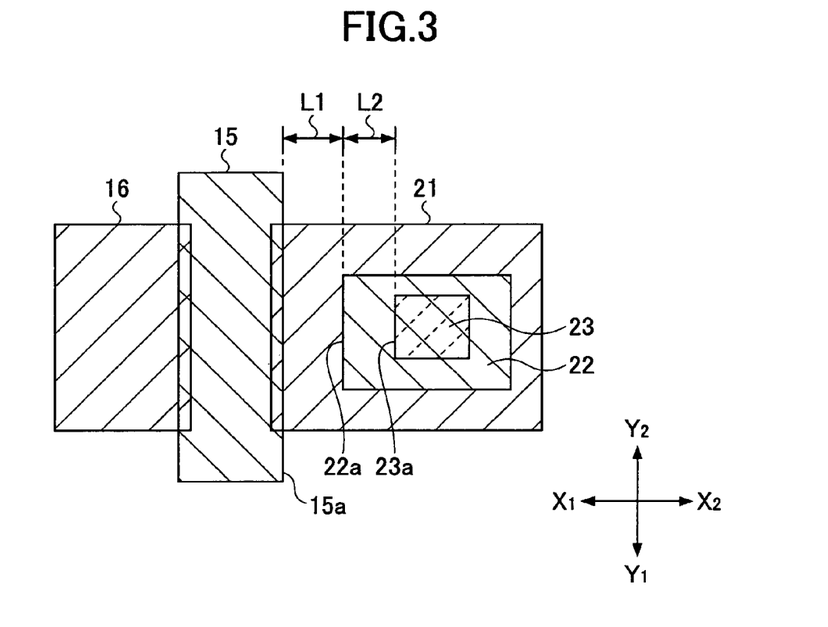
FIG. 3 is an exemplary plan view of the semiconductor device according to the first embodiment.

FIG. 2 is a diagram showing a configuration of a semiconductor device according to a first embodiment of the present invention. FIG. 3 is an exemplary plan view of the semiconductor device according to the first embodiment. It is noted that in the example described below, it is assumed that the semiconductor device corresponds to an n-channel MOS transistor.

According to the illustrated example of FIGS. 2 and 3, the semiconductor device 10 includes a silicon substrate 11, an isolation region 12, a p-well region 13 that is implanted in the activated region formed by the silicon substrate 11 and the isolation region 12, a silicon oxide film 14 that is formed on the silicon substrate 11 surface as a gate insulating film, a gate electrode 15 that is formed on the silicon oxide film 14, a source region 16 formed on one side of the gate electrode 15, a source electrode 18 that is in contact with the source region 16, a drain region 20 that is formed on the other side of the gate electrode 15, and a drain electrode 24 that is in contact with the drain region 20.

In the p-well region 13, a p-type impurity such as B (boron) may be implanted, and the impurity concentration in this region may be set to approximately $3.0 \times 10^{-16}$ cm$^{-3}$, for example. It is noted that in an alternative embodiment, a p-type silicon substrate may be used instead of the p-well region 13, for example.

The thickness of the silicon oxide film 14 is preferably within a range of 10~100 nm. It is noted that in an alternative embodiment, a silicon nitric oxide layer, a silicon nitride layer, or a high-k material such as $Al_2O_3$, $Ta_2O_3$, $HfO_2$, or $ZrO_2$ may be used instead of the silicon oxide film 14, for example.

The gate electrode 15 may be made of a polysilicon film, for example, and an impurity such as B (boron) or P (phosphorous) may be implanted therein to control its resistivity. The length in the gate length direction ($X_1$-$X_2$ direction) of the gate electrode 15 maybe set within a range of 0.6~5.0 μm. It is noted that when the length of the gate electrode 15 in the gate length direction is shorter than 0.6 μm, a short channel effect may likely occur when a high voltage is applied to the drain. When the gate length is longer than 5.0 μm, the device area may be too large.

The drain region 20 includes a first drain region 21 that extends from an end portion 15a of the gate electrode 15 in a direction toward the drain electrode 24 ($X_2$ direction), a drain contact region 23 that is formed within the first drain region 21 and comes into contact with the drain electrode 24, and a second drain region 22 that is formed around and underneath the drain contact region 23.

The first drain region 21 may be arranged to have a low impurity concentration around $8.0 \times 10^{16}$ cm$^{-3}$, for example, the drain contact region 23 may be arranged to have an impurity concentration that is higher than that of the first drain region 21 around $1.0 \times 10^{21}$ cm$^{-3}$, for example, and the second drain region 22 may be arranged to have an impurity concentration that is higher than that of the first drain region 21 but lower than that of the drain contract region 23 around $1.0 \times 10^{17}$ cm$^{-3}$, for example.

The second drain region 22 is positioned so that its end portion 22a toward the gate electrode 15 side may be set apart from the end portion 15a of the gate electrode 15. In this way, a short channel effect, which may occur when the drain voltage corresponds to a high voltage, may be prevented.

A distance L1 corresponding to the distance between the end portion 22a of the second drain region 22 toward the gate electrode 15 and the end portion 15a of the gate electrode 15 is preferably set to a suitable value within a range of 0.5~5.0 μm for realizing sufficient field dispersion. It is noted that when the distance L1 is less than 0.5 μm, the semiconductor device may be susceptible to the short channel effect. When the distance L1 is greater than 5.0 μm, the an on-resistance may not be sufficiently reduced.

Also, it is noted that the distance L1 is preferably increased within the above defined range according to an increase in the maximum drain voltage being used.

A distance L2 corresponding to the distance between the end portion 22a of the second drain region 22 toward the gate electrode 15 and an end portion 23a of the drain contact region 23 toward the gate electrode 15 is preferably arranged to be greater than or equal to the depth D22 of the bottom portion 22b of the second drain region 22. It is noted that a bipolar action may be prevented by arranging the gradient of the impurity concentration in a lateral direction from the drain contact region 23 to the second drain region 22 to be gradual.

Also, it is noted that the ratio L1/L2 is preferably set to approximately 1/1. In this way, an increase in the drain breakdown voltage and a decrease in the on-resistance may be effectively realized at the same time.

The bottom portion 22b of the second drain region 22 (junction between the second drain region 22 and the p-well region) is preferably formed at a depth that is greater than or equal to the depth of a bottom portion 21b of the first drain region 21. By placing the second drain region having a higher impurity concentration than the first drain region underneath the drain contact region 23, the concentration gradient from the drain electrode 24 in the depth direction (downward direction) may be gradual so that the field dispersion effect may be improved and a higher drain breakdown voltage during operation may be achieved.

It is noted that in a case where the bottom portion 22b of the second drain region 22 is formed at a depth that is greater than the depth of the bottom portion 21b of the first drain region 21, the impurity concentration of the second drain region 22 may be substantially equal to the impurity concentration of the first drain region 21. By arranging the bottom portion 22b of the second drain region 22 to be formed at a deeper position than that of the bottom portion 21b of the first drain region 21, the concentration gradient from the drain electrode 24 in the depth direction (downward direction) may be gradual so that the field dispersion effect may be improved.

In a case where the impurity concentration of the second drain region 22 is higher than the impurity concentration of the first drain region 21, the depth of the bottom portion 22b of the second drain region 22 and the bottom portion 21b of the first drain region 21 may be arranged to be substantially the same depth. In this way the concentration difference between the drain contact region 23 and the second drain region 22 may be reduced, and the concentration gradient from the drain electrode 24 in the depth direction (downward direction) may be gradual so that the field dispersion effect may be improved.

Figure 4:
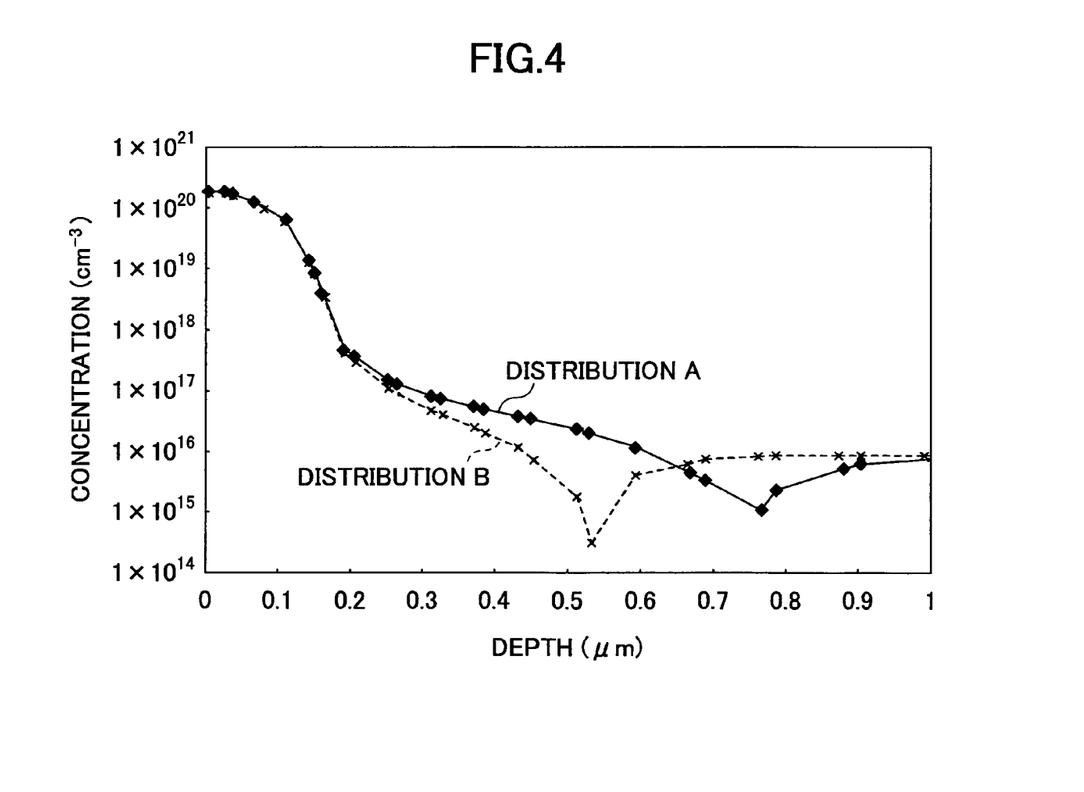
FIG. 4 is a graph illustrating an exemplary impurity concentration distribution in a drain contact region and elements located below this drain contact region.

FIG. 4 is a graph illustrating exemplary concentration distributions of a drain contact region and elements located below this drain contact region. According to this graph, the vertical axis indicates the impurity concentration (per cm$^{-3}$), and the horizontal axis indicates the depth (μm) from the surface of the silicon substrate 11. It is noted that distribution A shown in FIG. 4 represents an exemplary impurity distribution within the semiconductor device according to the present embodiment, and distribution B represents an exemplary impurity concentration distribution within a semiconductor device that does not include the second drain region 22 as a comparison example.

In the present example, the semiconductor device with the impurity distribution A is arranged such that P is implanted into the first drain region as the impurity with an accelerating voltage of 60 keV and a dosage of $2.0 \times 10^{12}$ cm$^{-2}$, P is implanted into the second drain region as an impurity with an accelerating voltage of 120 keV and a dosage of $2.0 \times 10^{12}$ $cm^{-2}$, and As is implanted into the drain contact region as an impurity with an accelerating voltage of 70 keV and a dosage of $4.0 \times 10^{15}$ $cm^{-2}$, using the ion implantation method. The semiconductor device with the impurity distribution B is formed in a manner similar to that described above except for the fact that the second drain region is not formed. It is noted that the impurity concentrations are obtained through simulation.

As is shown in FIG. 4, the gradients of the distributions A and B are substantially identical up to a depth of 0.2 μm, the region up to this point corresponding to the drain contact region. However, in the regions deeper than 0.2 μm, the concentration change of distribution A is smaller than that of the distribution B with respect to the depth direction, and the concentration gradient of distribution A is arranged to be more gradual. Such an effect is achieved from setting the accelerating voltage for the second drain region to a greater voltage than that for the first drain region, and positioning the second drain region underneath the drain contact region while arranging the bottom of the second drain region to be deeper than the bottom of the first drain region. By realizing such a gradual concentration gradient, the field dispersion effect may be improved.

Figure 5A:
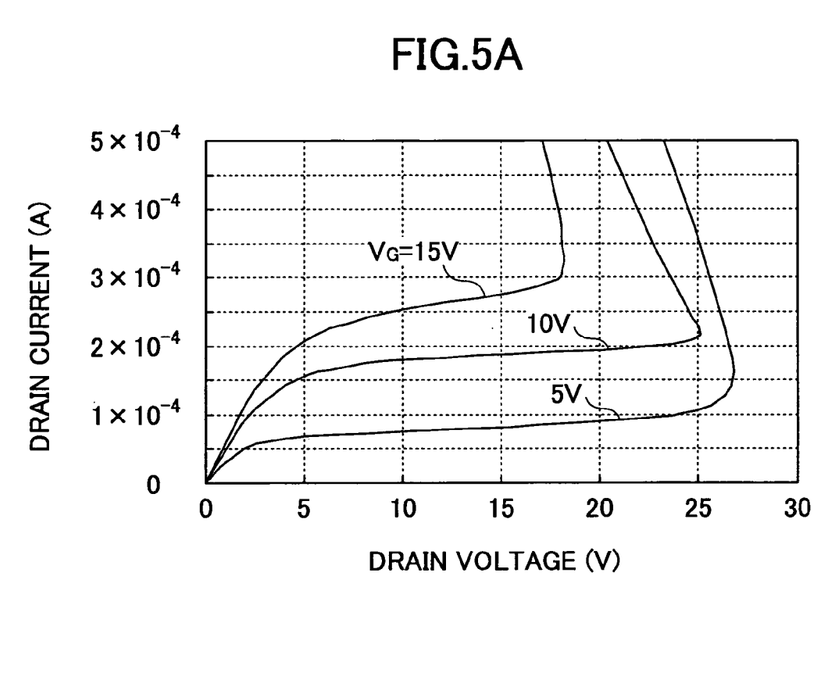
FIGS. 5A and 5B are graphs illustrating an exemplary characteristic relation between a drain current and a drain voltage in a semiconductor device according to the first embodiment.
Figure 5B:
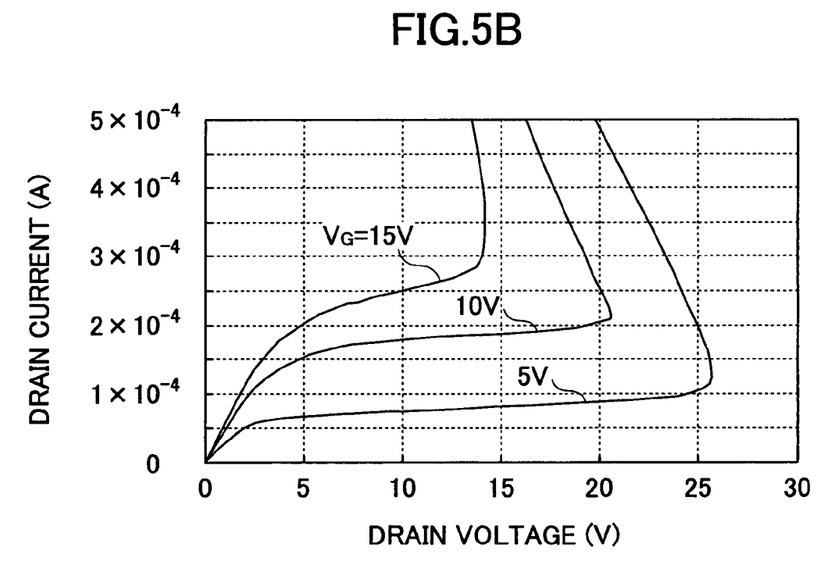

FIGS. 5A and 5B are graphs representing a characteristic relation between a drain current ($I_D$) and a drain voltage ($V_{DS}$). Specifically, FIG. 5A represents an example of such a characteristic in the semiconductor device according to the present embodiment, and FIG. 5B represents an example of such a characteristic in a semiconductor device that does not include a second drain region as a comparison example.

In the present example, it is assumed that P is implanted into the first drain region as the impurity with an accelerating voltage of 60 keV and a dosage of $2.0 \times 10^{12}$ $cm^{-2}$, P is implanted into the second drain region as an impurity with an accelerating voltage of 120 keV and a dosage of $2.0 \times 10^{12}$ $cm^{-2}$, and As is implanted into the drain contact region as an impurity with an accelerating voltage of 70 keV and a dosage of $4.0 \times 10^{15}$ $cm^{-2}$, using the ion implantation method. Also, in the present example, it is assumed that the distance L1 and L2 shown in FIGS. 2 and 3 are equal. The semiconductor device representing a comparison example is formed in a manner similar to that described above except for the fact that the second drain region is not formed. It is noted that the respective impurity concentrations of the semiconductor devices are obtained through simulation.

As is shown in FIGS. 5A and 5B, in the comparison example, with gate voltages $V_G$=5 V, 10 V, and 15 V, the corresponding drain currents increase abruptly at drain voltages around 26 V, 20 V, and 9 V, respectively, indicating the occurrence of the bipolar action. In the present embodiment, with the gate voltages $V_G$=5 V, 10 V, and 15 V, the corresponding drain currents increase abruptly at drain voltages around 27 V, 25 V, and 13 V, respectively, indicating the occurrence of the bipolar action. As can be appreciated from the above descriptions, the drain voltages at which bipolar actions occur are higher in the present embodiment compared to the comparison example, this signifying an increase in the drain breakdown voltage.

Figure 6:
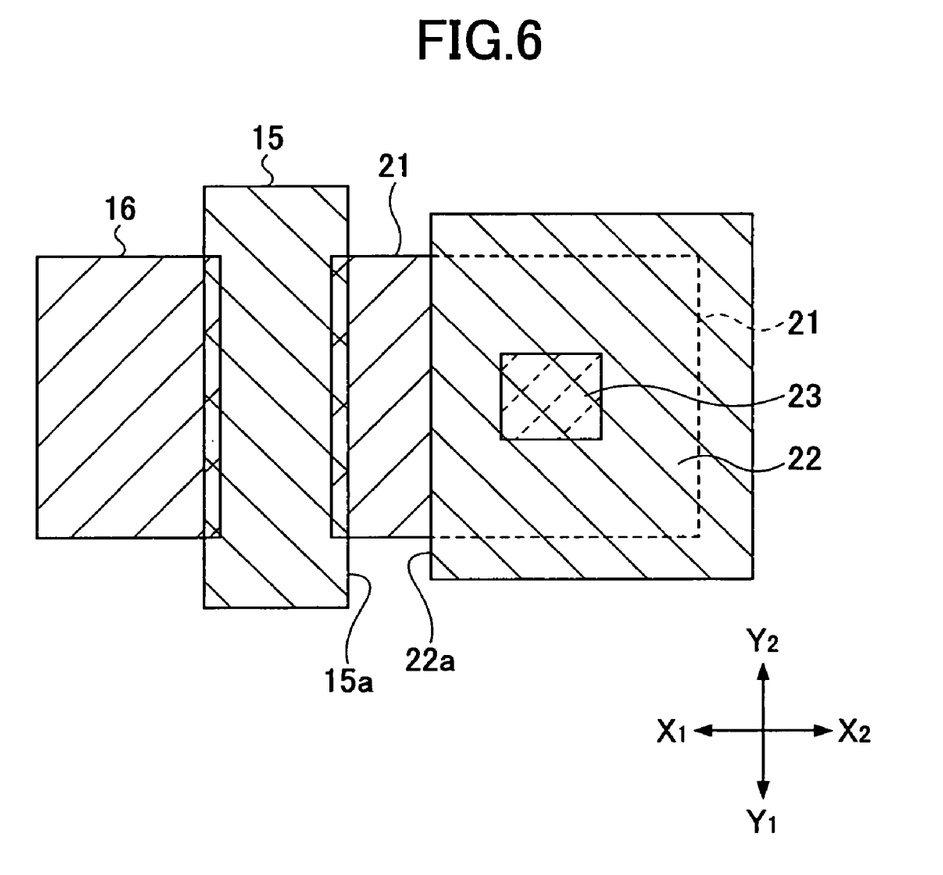
FIG. 6 is another exemplary plan view of the semiconductor device according to the first embodiment.

FIG. 6 is another exemplary plan view of the semiconductor device according to the present embodiment. In the example of FIG. 6, the second drain region 22 is arranged to have a greater dimension in the gate width directions ($Y_1$-$Y_2$ directions) compared to the first drain region 21. In this way, the on-resistance may be reduced further while preventing the bipolar action. It is noted that in an alternative example, the second drain region 22 may be arranged to have a greater dimension in the gate length direction extending away from the gate electrode 15 side ($X_2$ direction) compared to the first drain region 21.

In the following, a manufacturing method of the semiconductor according to an embodiment of the present invention is described.

FIGS. 7A~7C, 8A, and 8B are diagrams illustrating process steps for manufacturing the semiconductor device according to the first embodiment.

Figure 7A:
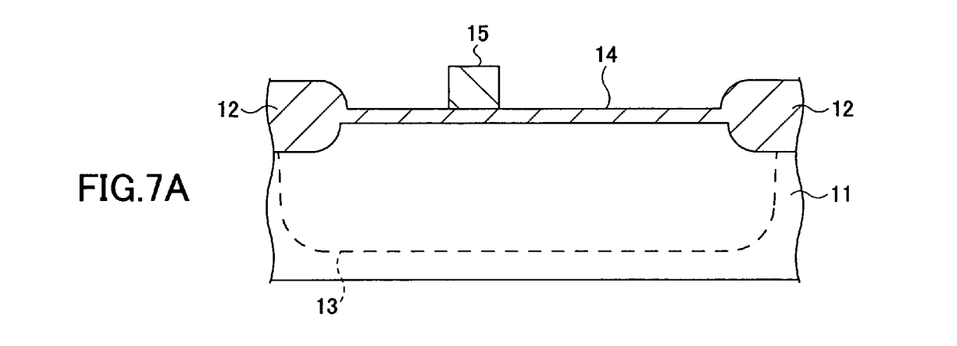
FIGS. 7A~7C are diagrams illustrating a manufacturing process of the semiconductor device according to the first embodiment.

Referring to FIG. 7A, first, a p-type impurity such as B is implanted in the silicon substrate 11 through ion implantation to form the p-well region 13.

Then, the isolation region 12 having a LOCOS structure is formed using a known method. For example, the formation of the isolation region having the LOCOS structure may be realized by forming a silicon oxide film on the surface of the silicon substrate 11 and selectively forming a silicon nitride film on a portion of the silicon oxide film corresponding to an activated region. It is noted that silicon oxide film and the silicon nitride film may be formed through spattering or CVD, for example, and the silicon oxide film may correspond to a thermal oxide film. Then, a thermal oxidation process may be conducted to form a thermal oxide film of the isolation region, and the silicon oxide film, the silicon nitride film, and the silicon oxide film formed on the activated region may be successively removed through etching so that the surface of the silicon substrate may be exposed. It is noted that the isolation region 12 may be formed through STI as well.

Then, in the process step of FIG. 7A, a silicon oxide film 14 is formed on the surface of the silicon substrate 11. The silicon oxide film 14 may have a thickness of 30 nm, and may be formed through thermal oxidation, spattering or CVD, for example.

Then, the gate electrode 15 is formed on the silicon oxide film 14. For example, the formation of the gate electrode 15 may be realized by forming a polysilicon layer (not shown) over the silicon oxide film 14, and forming a pattern on the layer through photolithography and etching. Also, an impurity may be implanted or included in the polysilicon layer to control the resistivity.

In the process step of FIG. 7B, a resist film 31 that covers the structure shown in FIG. 7A is formed, after which an opening 31-1 is formed that exposes a portion of the surface of the gate electrode 15 and a region that is to correspond to the first drain region in a later process.

Then, the resist 31 and the gate electrode 15 are used as masks to implant an n-type impurity such as P or As into the region corresponding to the first drain region to thereby form the first drain region 21. For example, in a case where P is implanted as the impurity, the dosage may be set to be within a range of $1 \times 10^{-12}$~$1 \times 10^{-13}$ $cm^{-2}$, and the accelerating voltage may be set to be within a range of 50~150 keV, and in a case where As is implanted as the impurity, the dosage may be set to be within a range of $1 \times 10^{-12}$~$1 \times 10^{-13}$ $cm^{-2}$, and the accelerating voltage may be set to be within a range of 100~300 keV.

Figure 7B:
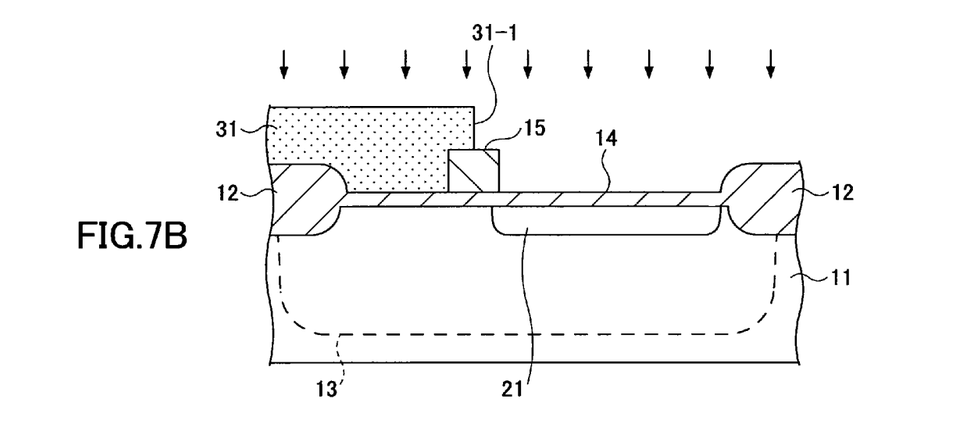
Figure 7C:
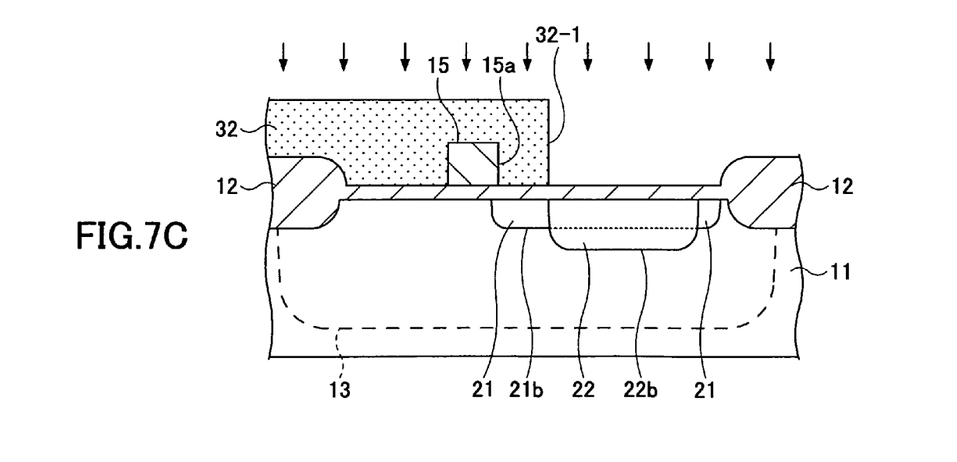

Then, in the process step of FIG. 7C, the resist film 31 of FIG. 7B is removed and a resist film 32 is formed over the semiconductor structure, after which an opening 32-1 is formed that exposes the surface of an inner section of the first drain region 21. The opening 32-1 may be arranged to expose a region extending from a position that is distanced away from the end portion 15a of the gate electrode 15 toward the first drain region 21 side by the predetermined distance L2 as is described in relation to FIG. 2, the exposed region extending over a region that is to correspond to the drain contact region in a subsequent process.

Then, the resist film 32 may be used as a mask to implant an n-type impurity such as P or As through ion implantation to form the second drain region 22. In this case, the ion implantation dosage for this second drain region may be set to be higher than that for the first drain region 21, and the accelerating voltage may be set to be higher or substantially equal to that for the first drain region. For example, in a case where P is implanted as the impurity, the dosage may be set to be within a range of $1 \times 10^{-12} \sim 1 \times 10^{-13}$ cm$^{-2}$, and the accelerating voltage may be set to be within a range of 100~200 keV, and in a case where As is implanted as the impurity, the dosage may be set to be within a range of $1 \times 10^{-12} \sim 1 \times 10^{-13}$ cm$^{-2}$, and the accelerating voltage may be set to be within a range of 200~400 keV. It is noted that P is preferably used as the impurity since P may be easily reach a greater depth upon being implanted.

It is also noted that in an alternative example, the ion implantation dosage for forming the second drain region 22 may be set to be substantially equal to the dosage for forming the first drain region 21, and the accelerating voltage for the second drain region 22 may be set to be higher than that for the first drain region. In this case, the impurity concentrations of the first and second drain regions may be substantially the same. However, by arranging the bottom portion 22b of the second drain region 22 to be formed at a deeper position than the position of the bottom portion 21b of the first drain region 21, the concentration gradient in a depth direction within the regions below the gate electrode may be arranged to be gradual and the field dispersion may be improved.

Figure 8A:
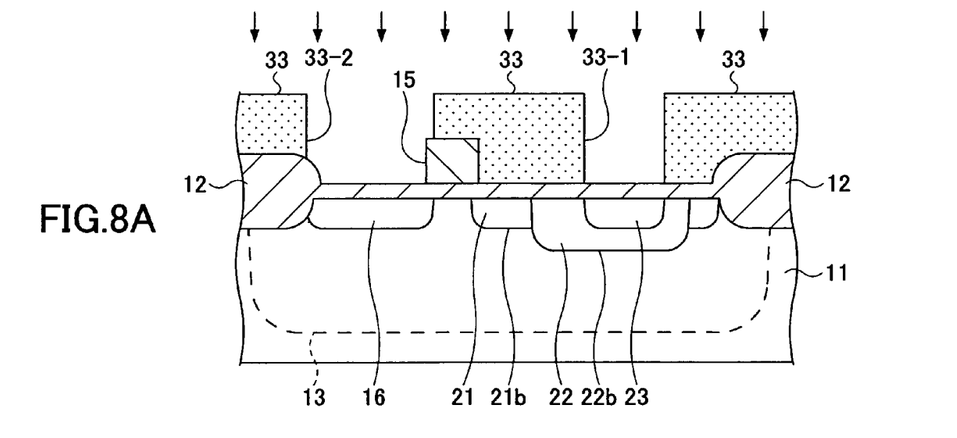
FIGS. 8A and 8B are diagrams illustrating the process of manufacturing the semiconductor device according to the first embodiment, continued from FIG. 7.

In the process step of FIG. 8A, the resist film 32 of FIG. 7C is removed, and a resist film 33 is formed over the semiconductor structure. Then an opening 33-1 is formed that exposes a portion of the silicon oxide film 14 that is to correspond to the drain contact region formed within the second drain region. Also, an opening 33-2 is formed that exposes portions of the silicon oxide film 14 and the gate electrode 15 that are to correspond to the source region 16.

Then, the resist film 33 and gate electrode 15 are used as masks to form the drain contact region through ion implantation using an n-type impurity such as P or As, for example. It is noted that the ion implantation dosage for forming the drain contact region 23 is set to a higher dosage than that for forming the first drain region 21, and accelerating voltage is set so that the drain contact region 23 may be formed around the surface of the silicon substrate 11. For example, in a case where P is implanted as the impurity, the dosage may be set to be within a range of $1 \times 10^{-15} \sim 1 \times 10^{-16}$ cm$^{-2}$, and the accelerating voltage may be set to be within a range of 25~50 keV, and in a case where As is implanted as the impurity, the dosage may be set to be within a range of $1 \times 10^{-15} \sim 1 \times 10^{-16}$ cm$^{-2}$, and the accelerating voltage may be set to be within a range of 50~100 keV. It is noted that As is preferably used as the impurity in order to prevent the diffusion of the impurity in the depth direction. It is also noted that the ion implantation for forming the source region 16 may be conducted in a separate process from that for forming the drain contact region 23.

Figure 8B:
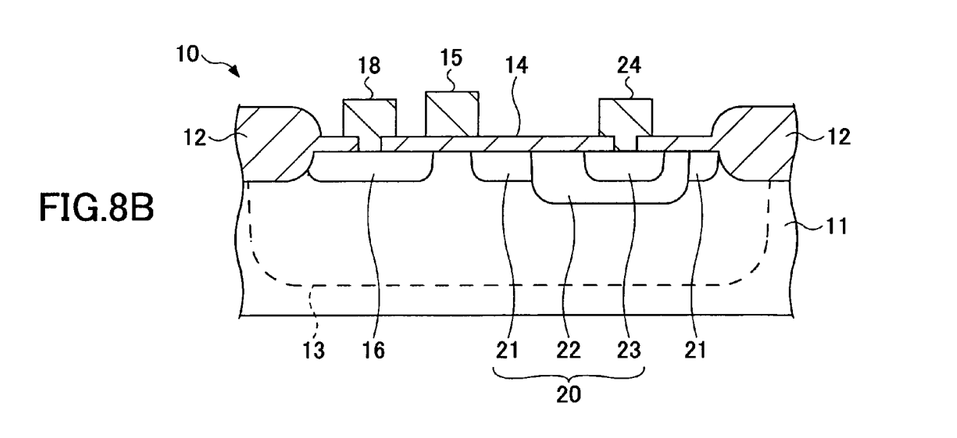

Then, in the process step of FIG. 8B, the resist film 33 shown in FIG. 8A is removed, and openings are formed that expose the surface portions of the silicon substrate 11 corresponding to the drain contact region 23 and the source region 16, the openings being used to form the drain electrode 24 and the source electrode 18, respectively.

The drain electrode 24 and the source electrode 18, which may include a barrier film such as a TiN film or a TaN film and a Al or Al—Si, for example, may be formed using a conventional method. It is noted that a silification process may be conducted or a silicide film may be formed on the silicon substrate surface where the drain electrode 24 and the source electrode 18 come into contact. In this way, the semiconductor device 10 according to the present embodiment may be produced. Then, using a know technique, an interlayer insulating film, a wiring layer, a passivation film, an external electrode, for example, may be implemented as is necessary or desired to form an IC chip.

In the present embodiment, by placing the second drain region 22 with a low concentration of an n-type impurity underneath the drain contact region 23 with a high concentration of an n-type impurity, the concentration gradient in the depth direction from the high concentration drain contact region 23 via the low concentration second drain region 22 to the junction with the p-well region 13 may be reduced, and sufficient thickness may be secured for a depletion layer that is generated at the junction between the first drain region 21 at the gate electrode 15 side and the p-well region 13 so that the field dispersion may be improved. Also, by setting the second drain region 22 apart from the end portion 15a of the gate electrode 15, the generation of the short channel effect may be prevented. In turn, a higher drain breakdown voltage during operation may be achieved.

Second Embodiment

Figure 9:
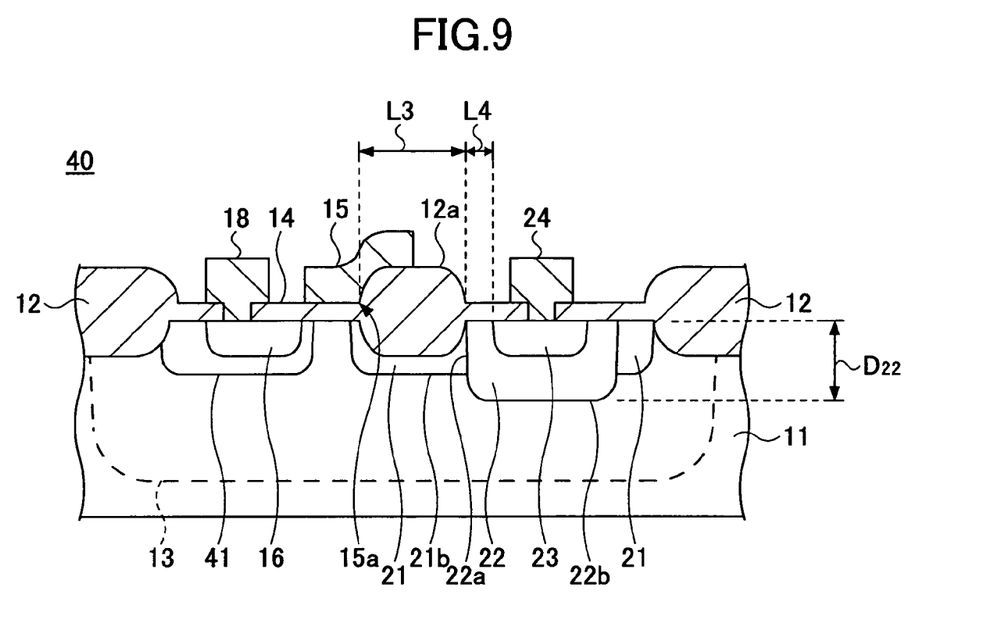
FIG. 9 is a cross-sectional diagram showing a configuration of a semiconductor device according to a second embodiment of the present invention.

FIG. 9 is a cross-sectional diagram showing a configuration of a semiconductor device according to a second embodiment of the present invention. It is noted that in this drawing, elements that are identical to those shown in relation to the first embodiment are assigned the same numerical references, and their descriptions are omitted.

The semiconductor device 40 according to the second embodiment as is shown in FIG. 9 may correspond to an LD (Laterally Diffused) MOS transistor that includes a silicon substrate 11, an isolation region 12, a p-well region that is arranged at an activated region formed by the isolation region 12, a silicon oxide film 14 that is formed on the surface of the silicon substrate 11 as a gate insulating film, a field oxide film 12a that is continuous with the silicon oxide film 14 and is positioned toward the drain electrode side, a gate electrode 15 that is formed over portions of the silicon oxide film 14 and the field oxide film 12a, a p-well body region 41 that is provided in the activated region on the source electrode side of the silicon oxide film 14, an n-type source region 16 that is provided within the p-well body region 41, a source electrode 18 that is in contact with the source region 16, a first drain region 21 that extends from a region around the boundary between the silicon oxide film 14 and the field oxide film 12a to the drain electrode 24, a drain contact region 23 that is in contact with the drain electrode 24, and a second drain region 22 that is formed around and below the drain contact region 23.

It is noted that the configuration of the semiconductor device 40 with regard to the impurity concentration and the depth settings of the first drain region 21, the second drain region 22, and the drain contact region 23 may be identical to that of the semiconductor device of the first embodiment, and thereby descriptions pertaining to such features are omitted. According to the present embodiment, the distance L3 between an end portion 22a at the gate electrode 15 side of the second drain region 22 and a position 15a of the gate electrode 15 right above the boundary between the silicon oxide film 14 and the field oxide film 12a (i.e., end portion 15a at the drain electrode 24 side of the gate electrode 15) is preferably set to a suitable value within a range of 0.5~5.0 μm. When the distance L3 is below 0.5 μm, the short channel effect may easily occur, and when the distance L3 exceeds 5.0 μm, the on-resistance may not be sufficiently reduced.

Also, it is noted that the distance L4 between the end portion 22a at the gate electrode 15 side of the second drain region 22 and an end portion 23a at the gate electrode 15 side of the drain contact region 23 is preferably set to be greater than or equal to the depth D22 of a bottom portion 22b of the second drain region 22. In this way, the gradient of the impurity concentration in the horizontal direction from the drain contact region 23 and the second drain region 22 may be arranged to be gradual, and the generation of the bipolar action may be prevented. Further, it is preferred that the ratio L3/L4 is substantially equal to 1/1. In this way, improvement of the drain breakdown voltage and reduction of the on-resistance may both be effectively achieved.

According to the present embodiment, a higher drain breakdown voltage during operation may be achieved in a LDMOS transistor by implementing a second drain region as is described above.

Third Embodiment

Figure 10:
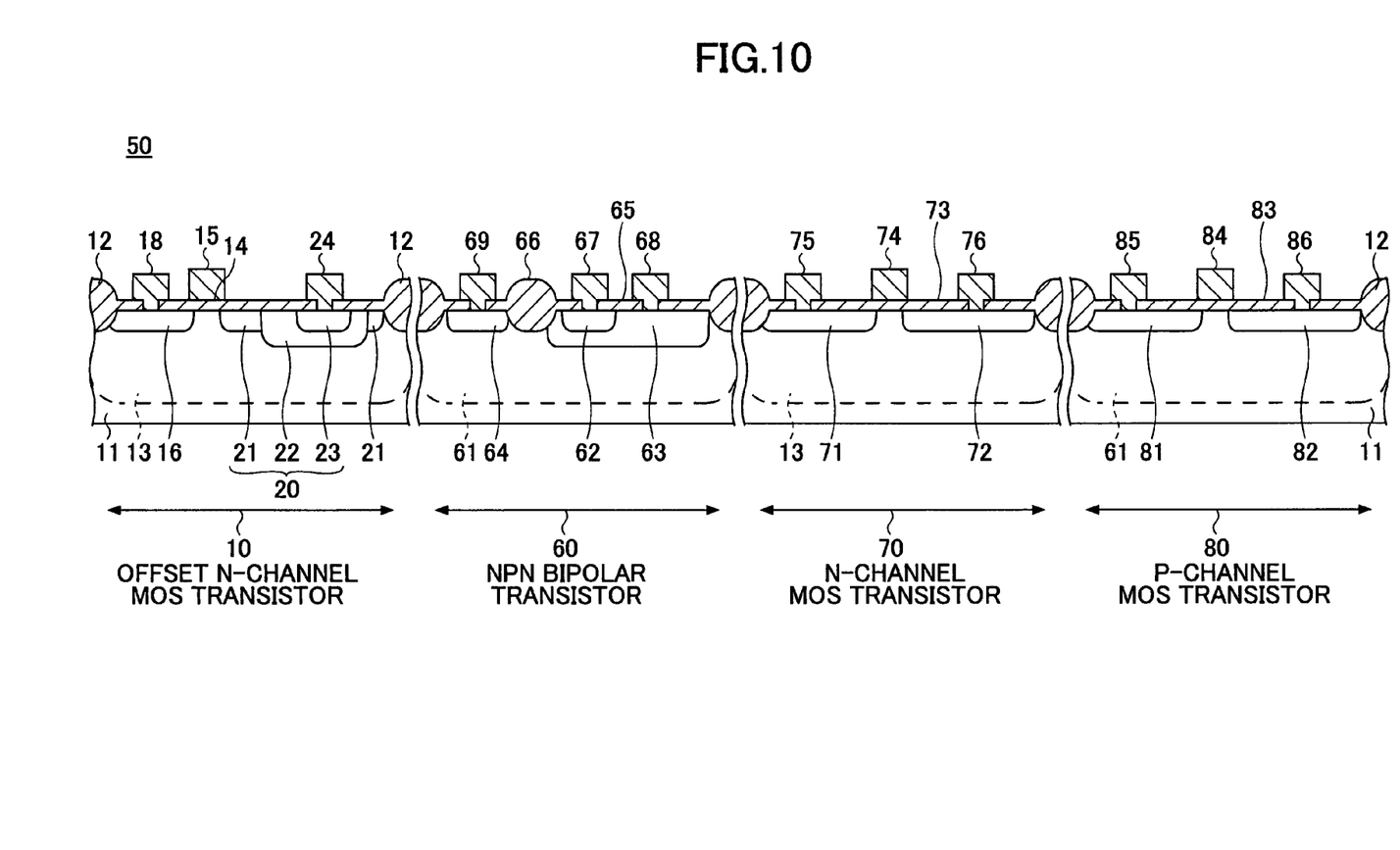
FIG. 10 is a cross-sectional diagram showing a configuration of a semiconductor device according to a third embodiment of the present invention.

FIG. 10 is a diagram showing a semiconductor device according to a third embodiment of the present invention. It is noted that in this drawing, elements that are identical to those described in relation to the previous embodiments are assigned the same numerical references and their descriptions are omitted.

The semiconductor device 50 shown in FIG. 10 includes an offset n-channel MOS transistor 10, an npn bipolar transistor 60, an n-channel MOS transistor 70, and a p-channel MOS transistor 80.

The npn bipolar transistor 60 includes a base, an emitter, and a collector that is provided in an element region formed by a silicon substrate 11 and an isolation region 12.

The emitter includes, an n-well region 61, an n-type emitter 62 that is formed inside a p-type base region 63 provided at a surface layer of the silicon substrate 11 within the n-well region 61, and an emitter electrode 67 that is connected to the emitter region 62 via a contact hole that is formed at a silicon oxide film 65.

The base includes a p-type base region 63, and a base electrode 68 that is connected to the base region via a contact hole formed at the silicon oxide film 65.

The collector includes an n-type collector region 64 that is separated from the emitter by a field oxide film 66, and a collector electrode 69 that is connected to the collector region 64 via a contact hole formed on the silicon oxide film. The collector region 64 forms a junction between the p-type base 63 via the n-well region 61.

The n-channel MOS transistor 70 includes a p-well region 13 that is provided in an element region formed by a silicon substrate 11 and an isolation region 12, an n-type source region 71 and a drain region 72 that are formed within the p-well region 13, and a silicon oxide film 73 and gate electrode 74 as a gate oxide film formed on a portion of the silicon substrate 11 between the source region 71 and the drain region 72. The source region 71 and the drain region 72 are connected to a source electrode 75 and a drain electrode 76, respectively, via contact holes formed on the silicon oxide film 73.

The p-channel MOS transistor 80 includes an n-well region 61 that is provided between an element region that is formed by a silicon substrate 11 and an isolation region 12, a p-type source region 81 and drain region 82 that are formed within the n-well region 61, and a silicon oxide film 83 and a gate electrode 84 that are formed on the silicon substrate 11 between the source region 81 and the drain region 82 as a gate oxide film. The source region 81 and the drain region 82 are connected to a source electrode 85 and a drain electrode 86, respectively, via contact holes formed on the silicon oxide film 83.

The offset n-channel MOS transistor 10 may have a configuration identical to that described in relation to the first embodiment.

The npn bipolar transistor 60, the n-channel MOS transistor 70 (e.g., a low breakdown voltage n-channel MOS transistor for a control circuit), and the p-channel MOS transistor 80 may be formed using known methods. For example, the transistors may be formed in the manner described above in relation to the first embodiment. The n-well region 61 of the npn bipolar transistor 60 and the n-well region 61 of the p-channel MOS transistor 80 may be simultaneously formed through ion implantation, for example. The p-well region 13 of the offset n-channel MOS transistor 10 and the p-well region 13 of the n-channel MOS transistor 70 may be simultaneously formed through ion implantation, for example. The second drain region 22 of the offset n-channel MOS transistor 10, the emitter region 62 of the npn bipolar transistor 60, and the source region 71 and the drain region 72 of the n-channel MOS transistor 70 may be simultaneously formed through ion implantation, for example. By conducting the ion implantation for plural types of transistors at the same time, the process of manufacturing a semiconductor device that implements plural types of transistors may be simplified.

According to the present embodiment, by implementing the offset n-channel MOS transistor 10 in the semiconductor device, a higher drain breakdown voltage during operation may be achieved. That is, the n-channel MOS transistor 10 includes a second drain region 22 that has a lower impurity concentration compared to the drain contact region 23 and a higher impurity concentration compared to the first drain region 21, for example, and thereby, the drain breakdown voltage during operation may be augmented.

In an alternative embodiment, the LDMOS transistor of the second embodiment may be used instead of the offset n-channel MOS transistor 10. Further, the present invention is not limited to the specific embodiments described above, and variations and modifications may be made without departing from the scope of the present invention.

The present application is based on and claims the benefit of the earlier filing date of Japanese Patent Application No. 2004-301787 filed on Oct. 15, 2004, the entire contents of which are hereby incorporated by reference.

What is claimed is:

1. A semiconductor device, comprising:
   a semiconductor substrate of a first conductivity type;
   a gate insulating film provided on a surface of the semiconductor substrate;
   a gate electrode provided on the gate insulating film;
   a first drain region of a second conductivity type corresponding to an opposite conductivity type with respect to the first conductivity type, the first drain region being provided in the vicinity of an end portion of the gate electrode;
   a drain contact region of the second conductivity type that is provided within the first drain region, the drain contact region having an impurity concentration that is higher than an impurity concentration of the first drain region; and
   a second drain region of the second conductivity type that is provided around and underneath the drain contact region; wherein the second drain region is arranged to have an impurity concentration that is lower than the impurity concentration of the drain contact region and higher than the impurity concentration of the first drain region, the second drain region has a greater dimension in a gate width direction than a dimension of the first drain region in the gate width direction, an end of the second drain region opposite to the gate electrode being more distant from the gate electrode than an end of the first drain region opposite to the gate electrode, and the second drain region having an impurity region extending to a deeper position than the first drain region in the depth direction of the semiconductor substrate;

an end portion of the second drain region at the gate electrode side is positioned away from the end portion of the gate electrode by a distance determined based on possible short channel effect and on-resistance reduction;

an end portion of the drain contact region at the gate electrode side is positioned away from the end portion of the second drain region at the gate electrode side by said distance; and said distance is greater than or equal to a depth of a bottom portion of the second drain region.

2. The semiconductor device as claimed in claim 1, wherein a bottom portion of the second drain region is positioned at a depth that is greater than a depth of a bottom portion of the first drain region.

3. The semiconductor device as claimed in claim 1, wherein the second drain region includes an impurity that is the same as an impurity of the drain contact region or an impurity that has a higher diffusion coefficient compared to the impurity of the drain contact region.

4. The semiconductor device as claimed in claim 1 that corresponds to an n-channel MOS transistor, wherein the first drain contact region and the second drain region include impurities corresponding to at least one of phosphorous and arsenic.

5. The semiconductor device as claimed in claim 1, wherein the predetermined distance is arranged to be within a range of 0.5~5.0 µm.

6. The semiconductor device as claimed in claim 1, wherein a distance between the end portion of the second drain region at the gate electrode side and an end portion of the drain contact region at the gate electrode side is arranged to be greater than or substantially equal to a depth of a bottom portion of the second drain region.

7. The semiconductor device as claimed in claim 1, wherein the second drain region is arranged to extend further in a gate width direction compared to the first drain region.

8. The semiconductor device as claimed in claim 1, wherein a length of the gate electrode with respect to a gate length direction is arranged to be within a range of 0.6~5.0 µm.

9. A semiconductor device, comprising:
a semiconductor substrate of a first conductivity type;
a gate insulating film provided on a surface of the semiconductor substrate;
a gate electrode provided on the gate insulating film;
a first drain region of a second conductivity type corresponding to an opposite conductivity type with respect to the first conductivity type, the first drain region being provided in the vicinity of an end portion of the gate electrode;
a drain contact region of the second conductivity type that is provided within the first drain region, the drain contact region having an impurity concentration that is higher than an impurity concentration of the first drain region; and a second drain region of the second conductivity type that is provided around and underneath the drain contact region; wherein the second drain region is arranged to have an impurity concentration that is lower than the impurity concentration of the drain contact region and substantially equal to the impurity concentration of the first drain region, the second drain region has a greater dimension in a gate width direction than a dimension of the first drain region in the gate width direction, an end of the second drain region opposite to the gate electrode being more distant from the gate electrode than an end of the first drain region opposite to the gate electrode, and the second drain region having an impurity region extending to a deeper position than the first drain region in the depth direction of the semiconductor substrate;

a bottom portion of the second drain region is positioned at a depth that is greater than a depth of a bottom portion of the first drain region;

an end portion of the second drain region at the gate electrode side is positioned away from the end portion of the gate electrode by a distance determined based on possible short channel effect and on-resistance reduction;

an end portion of the drain contact region at the gate electrode side is positioned away from the end portion of the second drain region at the gate electrode side by said distance; and said distance is greater than or equal to a depth of a bottom portion of the second drain region.

10. The semiconductor device as claimed in claim 9, wherein the second drain region includes an impurity that is the same as an impurity of the drain contact region or an impurity that has a higher diffusion coefficient compared to the impurity of the drain contact region.

11. The semiconductor device as claimed in claim 9 that corresponds to an re-channel MOS transistor, wherein the first drain contact region and the second drain region include impurities corresponding to at least one of phosphorous and arsenic.

12. The semiconductor device as claimed in claim 9, wherein the predetermined distance is arranged to be within a range of 0.5~5.0 µm.

13. The semiconductor device as claimed in claim 9, wherein a distance between the end portion of the second drain region at the gate electrode side and an end portion of the drain contact region at the gate electrode side is arranged to be greater than or substantially equal to a depth of a bottom portion of the second drain region.

14. The semiconductor device as claimed in claim 9, wherein the second drain region is arranged to extend further in a gate width direction compared to the first drain region.

15. The semiconductor device as claimed in claim 9, wherein a length of the gate electrode with respect to a gate length direction is arranged to be within a range of 0.6~5.0 µm.

16. A semiconductor device, comprising:
a semiconductor substrate of a first conductivity type;
a gate insulating film provided on a surface of the semiconductor substrate;
a field oxide film provided in continuity with the gate insulating film;
a gate electrode that is arranged to extend over the gate insulating film and the field oxide film;

a first drain region of a second conductivity type corresponding to an opposite conductivity type with respect to the first conductivity type, the first drain region being provided in the vicinity of a boundary portion between the gate insulating film and the field oxide film of the gate electrode;

a drain contact region of the second conductivity type that is provided within the first drain region, the drain contact region having an impurity concentration that is higher than an impurity concentration of the first drain region; and a second drain region of the second conductivity type that is provided around and underneath the drain contact region; wherein the second drain region is arranged to have an impurity concentration that is lower than the impurity concentration of the drain contact region and higher than the impurity concentration of the first drain region, the second drain region has a greater dimension in a gate width direction than a dimension of the first drain region in the gate width direction, an end of the second drain region opposite to the gate electrode being more distant from the gate electrode than an end of the first drain region opposite to the gate electrode, and the second drain region having an impurity region extending to a deeper position than the first drain region in the depth direction of the semiconductor substrate;

an end portion of the second drain region at the gate electrode side is positioned away from the boundary portion of the gate electrode by a distance determined based on possible short channel effect and on-resistance reduction;

an end portion of the drain contact region at the gate electrode side is positioned away from the end portion of the second drain region at the gate electrode side by said distance; and said distance is greater than or equal to a depth of a bottom portion of the second drain region.

17. The semiconductor device as claimed in claim 16 wherein the predetermined distance is arranged to be within a range of 0.5~5.0 μm.

18. An integrated semiconductor device, comprising:
a bipolar transistor; and
a semiconductor device including
a semiconductor substrate of a first conductivity type;
a gate insulating film provided on a surface of the semiconductor substrate;
a gate electrode provided on the gate insulating film;
a first drain region of a second conductivity type corresponding to an opposite conductivity type with respect to the first conductivity type, the first drain region being provided in the vicinity of an end portion of the gate electrode;
a drain contact region of the second conductivity type that is provided within the first drain region, the drain contact region having an impurity concentration that is higher than an impurity concentration of the first drain region; and
a second drain region of the second conductivity type that is provided around and underneath the drain contact region; wherein
the second drain region is arranged to have an impurity concentration that is lower than the impurity concentration of the drain contact region and higher than the impurity concentration of the first drain region, the second drain region has a greater dimension in a gate width direction than a dimension of the first drain region in the gate width direction, an end of the second drain region opposite to the gate electrode being more distant from the gate electrode than an end of the first drain region opposite to the gate electrode, and the second drain region having an impurity region extending to a deeper position than the first drain region in the depth direction of the semiconductor substrate;
an end portion of the second drain region at the gate electrode side is positioned away from the end portion of the gate electrode by a distance determined based on possible short channel effect and on-resistance reduction;
an end portion of the drain contact region at the gate electrode side is positioned away from the end portion of the second drain region at the gate electrode side by said distance; and
said distance is greater than or equal to a depth of a bottom portion of the second drain region.

19. An integrated semiconductor device, comprising:
a bipolar transistor; and
a semiconductor device including
a semiconductor substrate of a first conductivity type;
a gate insulating film provided on a surface of the semiconductor substrate;
a gate electrode provided on the gate insulating film;
a first drain region of a second conductivity type corresponding to an opposite conductivity type with respect to the first conductivity type, the first drain region being provided in the vicinity of an end portion of the gate electrode;
a drain contact region of the second conductivity type that is provided within the first drain region, the drain contact region having an impurity concentration that is higher than an impurity concentration of the first drain region; and
a second drain region of the second conductivity type that is provided around and underneath the drain contact region; wherein
the second drain region is arranged to have an impurity concentration that is lower than the impurity concentration of the drain contact region and substantially equal to the impurity concentration of the first drain region, an end of the second drain region opposite to the gate electrode being more distant from the gate electrode than an end of the first drain region opposite to the gate electrode, and the second drain region having an impurity region extending to a deeper position than the first drain region in the depth direction of the semiconductor substrate;
a bottom portion of the second drain region is positioned at a depth that is greater than a depth of a bottom portion of the first drain region, and the second drain region has a greater dimension in a gate width direction than a dimension of the first drain region in the gate width direction;
an end portion of the second drain region at the gate electrode side is positioned away from the end portion of the gate electrode by a distance determined based on possible short channel effect and on-resistance reduction;
an end portion of the drain contact region at the gate electrode side is positioned away from the end portion of the second drain region at the gate electrode side by said distance; and
said distance is greater than or equal to a depth of a bottom portion of the second drain region.

20. An integrated semiconductor device, comprising:
a bipolar transistor; and
a semiconductor device including
- a semiconductor substrate of a first conductivity type;
- a gate insulating film provided on a surface of the semiconductor substrate;
- a field oxide film provided in continuity with the gate insulating film;
- a gate electrode that is arranged to extend over the gate insulating film and the field oxide film;
- a first drain region of a second conductivity type corresponding to an opposite conductivity type with respect to the first conductivity type, the first drain region being provided in the vicinity of a boundary portion between the gate insulating film and the field oxide film of the gate electrode;
- a drain contact region of the second conductivity type that is provided within the first drain region, the drain contact region having an impurity concentration that is higher than an impurity concentration of the first drain region; and
- a second drain region of the second conductivity type that is provided around and underneath the drain contact region; wherein
the second drain region is arranged to have an impurity concentration that is lower than the impurity concentration of the drain contact region and higher than the impurity concentration of the first drain region, the second drain region has a greater dimension in a gate width direction than a dimension of the first drain region in the gate width direction, an end of the second drain region opposite to the gate electrode being more distant from the gate electrode than an end of the first drain region opposite to the gate electrode, and the second drain region having an impurity region extending to a deeper position than the first drain region in the depth direction of the semiconductor substrate;
- an end portion of the second drain region at the gate electrode side is positioned away from the boundary portion of the gate electrode by a distance determined based on possible short channel effect and on-resistance reduction;
an end portion of the drain contact region at the gate electrode side is positioned away from the end portion of the second drain region at the gate electrode side by said distance; and
said distance is greater than or equal to a depth of a bottom portion of the second drain region.

* * * * *